(12) United States Patent
Chang et al.

(10) Patent No.: US 6,580,072 B1
(45) Date of Patent: Jun. 17, 2003

(54) METHOD FOR PERFORMING FAILURE ANALYSIS ON COPPER METALLIZATION

(75) Inventors: Jonathan Cheang-Whang Chang, Mountain View, CA (US); Brian J. Wollard, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/564,058

(22) Filed: May 3, 2000

(51) Int. Cl.$^7$ .............................................. H01J 37/304
(52) U.S. Cl. ............... 250/297; 250/492.2; 250/492.21; 250/398; 250/309; 438/618; 438/620; 438/768; 257/700; 257/701; 257/706
(58) Field of Search .............................. 250/297, 492.2, 250/492.21, 398, 309; 438/618, 620, 768; 257/700, 701, 706

(56) References Cited

U.S. PATENT DOCUMENTS

| | | |
|---|---|---|
| 4,900,695 A | 2/1990 | Takahashi et al. |
| 4,936,968 A | 6/1990 | Ohnishi et al. |
| 5,028,780 A | 7/1991 | Kaito et al. |
| 5,086,015 A | 2/1992 | Itoh et al. |
| 5,140,164 A * | 8/1992 | Talbot et al. .................. 216/61 |
| 5,519,658 A | 5/1996 | Uda et al. |
| 5,583,344 A | 12/1996 | Mizumura et al. |
| 5,736,002 A | 4/1998 | Allen et al. |
| 5,824,598 A | 10/1998 | Yamaguchi et al. |
| 5,933,704 A | 8/1999 | Hwang et al. |
| 6,057,223 A * | 5/2000 | Lanford et al. ......... 204/192.15 |
| 6,365,502 B1 * | 4/2002 | Paranjpe et al. ............ 438/822 |

* cited by examiner

Primary Examiner—John R. Lee
Assistant Examiner—Zia R. Hashmi
(74) Attorney, Agent, or Firm—Arthur J. Behiel; Edel M. Young

(57) ABSTRACT

Described are methods of adapting FIB techniques to copper metallization, and to structures that result from the application of such techniques. A method in accordance with the invention can be used to sever copper traces without damaging adjacent material or creating conductive bridges to adjacent traces.

Semiconductor devices that employ copper traces typically include a protective passivation layer that protects the copper. This passivation layer is removed to render the copper traces visible to an FIB operator. The copper surface is then oxidized, as by heating the device in air, to form a copper-oxide layer on the exposed copper. With the copper-oxide layer in place, an FIB is used to mill through the copper-oxide and copper layers of a selected copper trace to sever the trace. The copper-oxide layer protects copper surfaces away from the mill site from reactive chemicals used during the milling process. In one embodiment, a copper-oxide layer of at least 40 nanometers thick affords adequate protection.

27 Claims, 2 Drawing Sheets

METHOD FOR PERFORMING FAILURE ANALYSIS ON COPPER METALLIZATION

FIELD OF THE INVENTION

The present invention relates to focused ion beam (FIB) methods used, for example, in failure analysis of Very Large Scale Integrated (VLSI) circuit devices. In particular, the present invention relates to methods and systems in which a FIB is used to mill copper conductors within integrated circuits.

BACKGROUND

A focused ion beam (FIB) system focuses ions into a beam and scans the beam across small areas of a sample. The beam interacts with the sample to produce secondary electrons that are then collected to produce an image of the sample. Raised areas on the sample produce more secondary ions than depressed areas, and this difference provides sufficient contrast to produce high-resolution images similar to that of a scanning electron microscope (SEM).

The ion beam typically employed by FIB systems uses Gallium ions. Gallium ions have sufficient energy (mass and speed) to mill sample surfaces. Thus, in addition to imaging, FIB systems can drill holes, cut metal lines, and connect metal lines (through metal deposition) in integrated circuits. These functions are often used in failure analysis. For example, drilling holes in an insulation layer can expose underlying features for test, and cutting and connecting metal lines can help to locate or confirm a failure. Such techniques can be performed in FIB systems that facilitate the identification of opens and shorts using voltage-contrast images. For a more detailed treatment of conventional FIB systems and voltage-contrast imaging, see U.S. Pat. No. 5,140,164, entitled "IC Modification With Focused Ion Beam System," by Talbot et al., and U.S. Pat. No. 5,521,516, entitled "Semiconductor Integrated Circuit Fault Analyzing Apparatus and Method Therefor," by Hanagama et al. Both of these patents are incorporated herein by reference.

Conventional FIB systems work well for milling aluminum conductors on integrated circuits. However, many in the semiconductor industry are pursuing new process technologies that employ copper metallization to produce superior circuits. Technologies that employ copper metallization would benefit from FIB imaging and milling in the same manner as technologies that employ aluminum metallization. Unfortunately, milling copper using conventional FIB systems has proved difficult.

Aluminum lines are typically formed on top of an insulating layer so that the top surface of the aluminum is above the top surface of the insulating layer. A passivation layer applied over the top of the aluminum and insulating layers to protect the aluminum follows the contours of the aluminum, resulting in raised areas over aluminum structures and valleys between them. This surface relief is easily identified using ion beam imaging and can therefore be used to locate lines of interest. In contrast, conventional copper metallization is formed within concavities (e.g., trenches) in an insulating layer. A subsequent planarization process, such as chemical-mechanical polishing, produces a flat surface in which the top surfaces of the copper and insulating layers are even. A passivation layer is then applied over the copper and insulating layers to protect the copper. The resulting structure is substantially flat, rendering it difficult or impossible to identify copper lines using ion-beam imaging.

The natural solution to the viewing problem is to remove the passivation layer over the copper lines. However, copper reacts strongly in the presence of gases used to enhance FIB etching during the milling process. Thus, the chemistry used to mill a very small feature attacks copper surfaces in the area surrounding the feature. For example, iodine used in gas-assisted etches attacks and destroys copper metallization in the immediate area of the milled feature. Further, severed copper lines can grow back together after FIB exposure. These and other problems associated with FIB milling of copper are noted in an article entitled "The Challenges of FIB Chip Repair and Debug Assistance in the 0.25 $\mu$m Copper Interconnect Millennium," by S. B. Herschbein, et al. (1998), which is incorporated herein by reference. Copper lines severed using FIB also suffer from electrical "bridging" between segments and with adjacent circuit features. This undesirable bridging is possibly the result of copper atoms displaced by the ion beam remaining in and around the mill site.

FIB techniques must be adapted for use with copper metallization if FIB methodology is to retain its usefulness as copper replaces aluminum as the interconnect metallurgy of choice for high-performance integrated circuits.

SUMMARY

The present invention is directed to methods of adapting FIB techniques to copper metallization, and to structures that result from the application of such techniques. A method in accordance with the invention can be used to sever copper traces without damaging adjacent material or creating conductive bridges to adjacent traces.

Semiconductor devices that employ copper traces typically include a protective passivation layer that protects the copper. This passivation layer is removed to render the copper traces visible to an FIB operator. The copper surface is then oxidized, as by heating the device in air, to form a copper-oxide layer on the exposed copper. With the copper-oxide layer in place, an FIB is used to mill through the copper-oxide and copper layers of a selected copper trace to sever the trace. The copper-oxide layer protects copper surfaces away from the mill site from reactive chemicals used to enhance etching during the milling process. In one embodiment, a copper-oxide layer at least 40 nanometers thick affords adequate protection.

In one embodiment, copper traces reside in concavities in an underlying insulating layer. These conventional structures are formed using a planar process, such as chemical-mechanical polishing, before applying the passivation layer. When subjected to FIB techniques in accordance with the invention, copper traces disposed within the concavities are encapsulated by the insulating and copper-oxide layers prior to milling. The milling process then produces a trench that extends through the copper-oxide layer, the copper, and into the underlying insulating layer.

This summary does not purport to define the invention; the appended claims define the invention.

DETAILED DESCRIPTION

Figure 1:
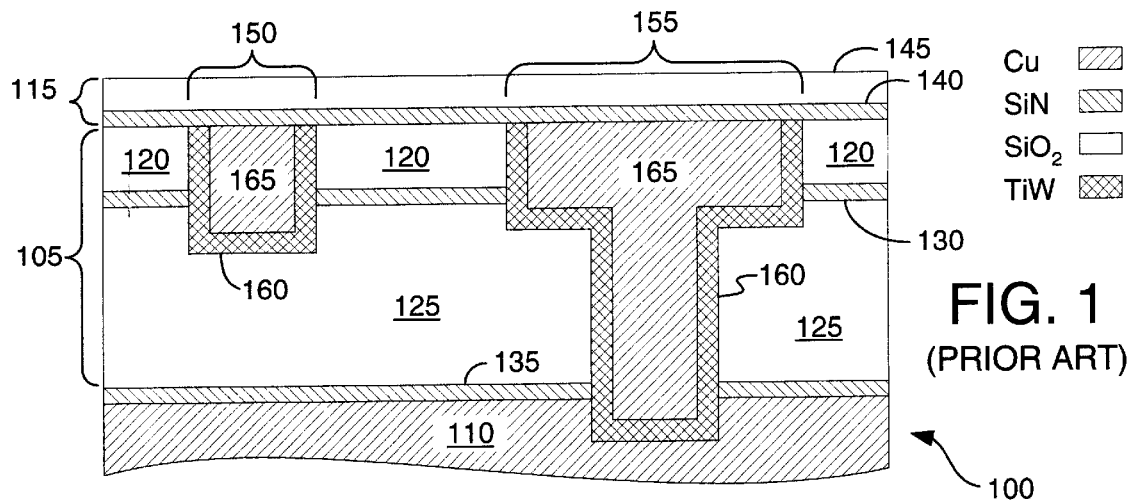
FIG. 1 (prior art) is a cross-section of a portion of an integrated circuit structure 100 formed using a modern damascene copper electroplating process.

FIG. 1 (prior art) is a cross section of a portion of an integrated circuit structure 100 formed using a modern damascene copper electroplating process. Structure 100 includes an insulating layer 105 disposed between a lower metal layer 110 and a passivation layer 115. Insulating layer 105 includes two silicon dioxide layers 120 and 125 separated by a silicon nitride etch-stop layer 130. A second silicon nitride etch-stop layer 135 separates silicon dioxide layer 125 from the underlying metal layer 110. Passivation layer 115 includes a silicon nitride layer 140 and a plane oxide 145. Other embodiments use different types and numbers of layers to passivate structure 100, as will be obvious to those of skill in the art.

A pair of conductive elements 150 and 155 extend into insulating layer 105. Each conductive element includes remnants of a seed layer 160, typically a tantalum alloy (e.g., TaNx), provided to facilitate electroplating of copper metal 165. For a detailed discussion of a damascene process suitable for use in conjunction with the invention, see "Damascene Copper Electroplating For Chip Interconnections," by P. C. Andricacos, et al. (1998), which is incorporated herein by reference.

Figure 2:
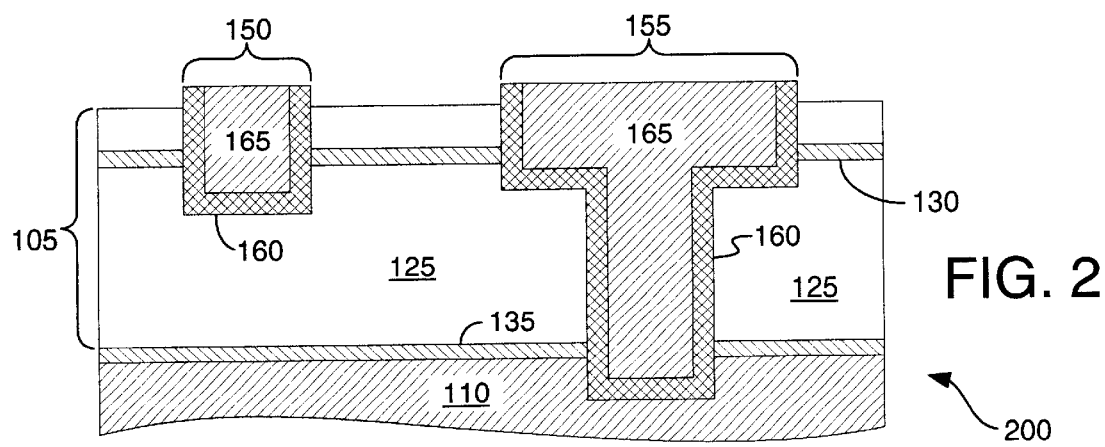
FIG. 2 depicts a structure 200 formed by stripping a portion of passivation layer 115 from structure 100 of FIG. 1 to expose the surfaces of conductive elements 150 and 155.

The following discussion assumes that conductive element 165 is a circuit trace, and further that conductive element 165 should be severed. Referring to FIG. 2, passivation layer 115 and a portion of insulating layer 105 are first stripped away to expose the surface of conductive elements 150 and 155. In one embodiment, passivation layer 115 and a portion of silicon dioxide layer 120 are removed using a reactive ion etch using a mixture of carbon tetrafluoride ($CF_4$) and oxygen ($O_2$) gases at respective partial pressures of 60 mtorr and 120 mtorr. The etch was carried out at 150 watts for about five minutes, leaving about fifty to sixty percent of silicon dioxide layer 120. Exposing conductive elements 150 and 155 allows an FIB system operator to view and locate conductive element 150.

Conductive element 150 is to be cut using an enhanced FIB etch that employs iodine gas. Other gases, such as chlorine and bromine, can also be used to enhance the etch. The reactive gases used to enhance the etch would severely damage neighboring copper structures (e.g., conductive element 165) in the absence of some protection. Thus, referring to FIG. 3, a protective copper oxide layer 305 is grown on the expose surfaces of conductive elements 150 and 155. Experimental data suggest that oxide layer 305 should be about forty nanometers thick (or more) to afford a sufficient level of protection to sever a copper line that is approximately one micron wide and 0.75 microns thick using an enhanced FIB etch. In one embodiment, a copper oxide layer of sufficient thickness was formed by heat treating structure 100 in air on a hot plate at 300 degrees Celsius for 60 minutes.

Figure 3:
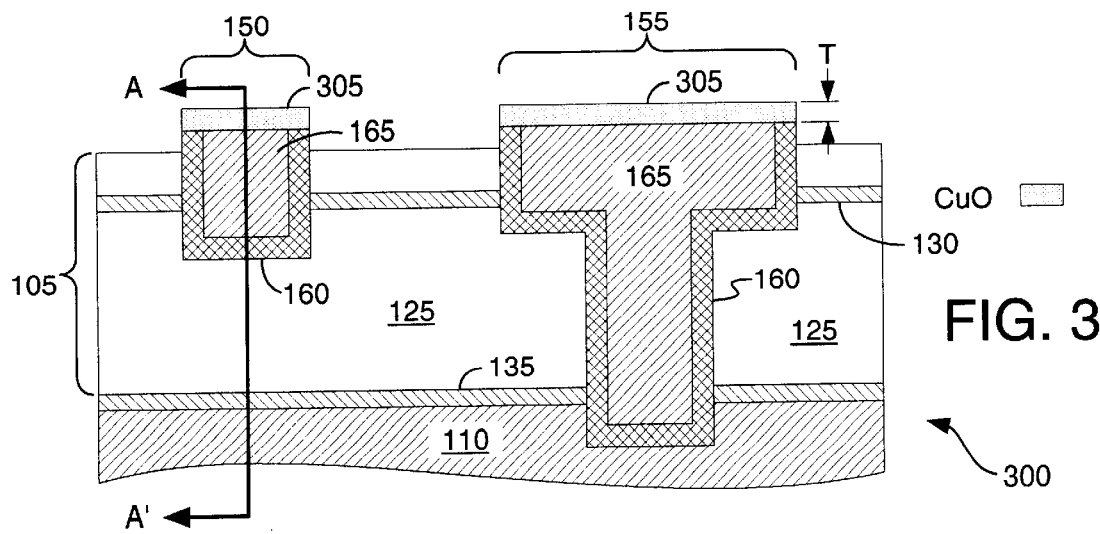
FIG. 3 depicts a structure 300 formed by exposing structure 200 of FIG. 2 to an oxidizing environment to form a protective oxide layer 305 over conductive elements 150 and 155.
Figure 4A:
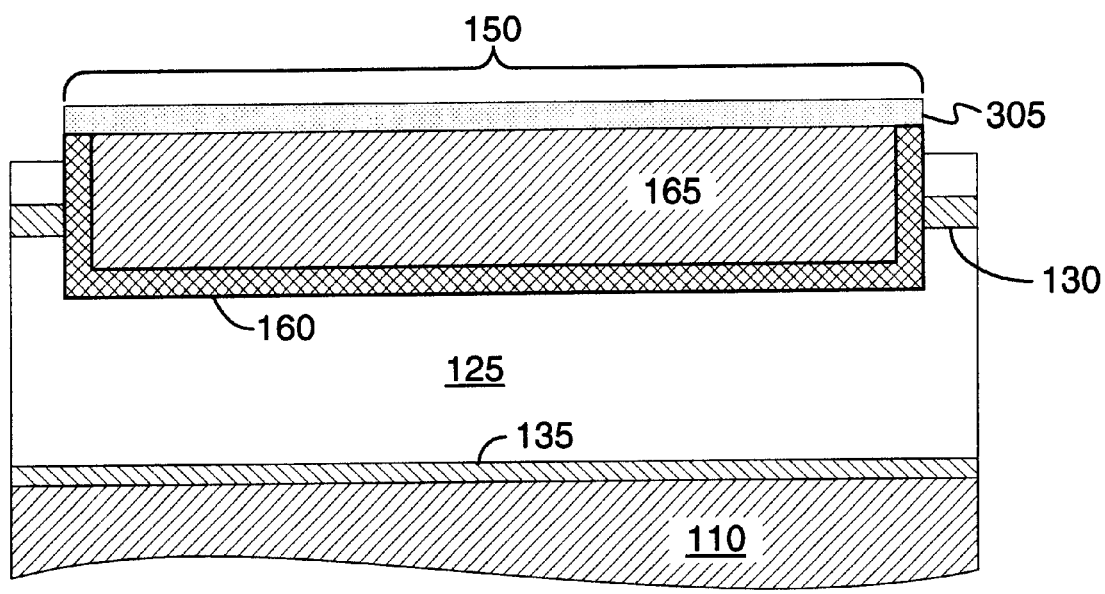
FIG. 4A shows a cross section of structure 300 taken along line A–A' of FIG. 3.
Figure 4B:
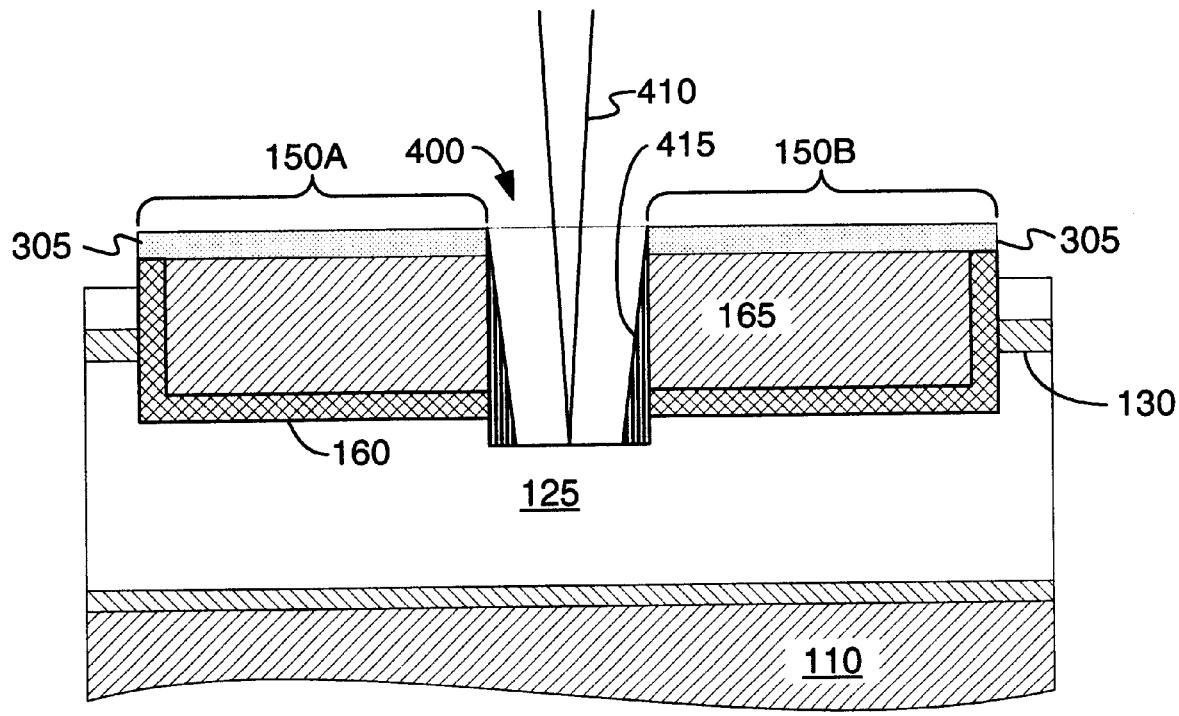
FIG. 4B is a cross-section similar to that of FIG. 4A but including an isolation cut 400 severing conductive element 150 into two portions 150A and 150B.

FIG. 4A shows a cross section of structure 300 taken along line A–A' of FIG. 3. FIG. 4B is also a cross-section of structure 300 taken along line A–A' of FIG. 3, but includes an isolation cut 400 severing conductive element 150 into two portions 150A and 150B. In one embodiment, isolation cut 400 is created using a conventional gallium-ion beam 410 at 12 pA in an enhanced etch mode that uses iodine ($I_2$) gas. The FIB milling process produces a residue of milled material 415 that builds up on the walls of isolation cut 400. For a detailed discussion of an exemplary FIB system for use with the present invention, see U.S. Pat. No. 5,140,164 to Talbot et al., issued Aug. 18, 1992, which is incorporated herein by reference.

While the present invention has been described in connection with specific embodiments, variations of these embodiments will be obvious to those of ordinary skill in the art. For example, the conductor severed in the above examples was a top-layer conductor; however, other metal layers can also be modified in accordance with the invention. Therefore, the spirit and scope of the appended claims should not be limited to the foregoing description.

What is claimed is:

1. A method of separating a conductive element into first and second conductive portions, wherein the conductive element includes copper and is disposed between an upper insulating layer and a lower insulating layer, the method comprising:
   a. removing the upper insulating layer to expose a surface of the conductive element;
   b. oxidizing the exposed surface of the conductive element to form a copper-oxide layer over the exposed surface;
   c. focusing an ion beam between the first and second conductive portions of the conductive element until the first conductive portion is electrically isolated from the second conductive portion.

2. The method of claim 1, wherein oxidizing the exposed surface of the conductive element comprises heating the conductive element.

3. The method of claim 2, wherein the conductive element is exposed to air during the heating.

4. The method of claim 2, wherein the conductive element is maintained above 100 degrees Celsius during the heating.

5. The method of claim 4, wherein the conductive element is maintained at about 300 degrees Celsius during the heating.

6. The method of claim 5, wherein the conductive element is maintained at about 300 degrees Celsius for more than 10 minutes.

7. The method of claim 6, wherein the conductive element is maintained at about 300 degrees Celsius for about 60 minutes.

8. The method of claim 2, wherein the conductive element is heated for more than 10 minutes.

9. The method of claim 1, further comprising scanning the surface of the conductive element to locate the conductive element before focusing the ion beam between the first and second conductive portions.

10. The method of claim 9, further comprising scanning the surface of the conductive element a second time to determine whether the first and second conductive portions are electrically isolated.

11. The method of claim 1, wherein the conductive element is disposed between first and second insulating walls extending from the lower insulating layer, and wherein removing the upper insulating layer to expose the surface of the conductive element leaves at least a portion of the first and second insulating walls.

12. The method of claim 11, wherein the first and second insulating walls are formed by etching a channel in the lower insulating layer.

13. The method of claim 1, wherein the upper conductive layer comprises at least one of silicon nitride or silicon dioxide.

14. The method of claim 1, wherein the lower conductive layer comprises at least one of silicon nitride and silicon dioxide.

15. The method of claim 1, wherein the ion beam comprises gallium.

16. The method of claim 1, wherein the ion beam is focused in the presence of at least one of bromine, iodine, or chlorine to electrically isolate the first conductive portion from the second conductive portion.

17. A semiconductor device structure comprising:
   a. an insulating layer having a concavity;
   b. a conductive element comprised of copper and disposed in the concavity of the insulating layer;
   c. an oxide layer comprised of copper and disposed on the conductive element;
   d. wherein the oxide layer is at least 40 nanometers in a dimension normal to the surface of the insulating layer.

18. The structure of claim 17, further comprising an isolation cut extending through the conductive element and into the insulating layer below the conductive element.

19. The structure of claim 17, wherein the isolation cut is formed by ion milling.

20. The structure of claim 17, wherein the insulating layer comprises silicon dioxide and silicon nitride.

21. The structure of claim 20, wherein the silicon nitride forms a first stratum within the insulating layer and the silicon dioxide forms a second stratum within the insulating layer.

22. The structure of claim 17, wherein at least a portion of the conductive element extends through the insulating layer and into an underlying conductive layer.

23. The structure of claim 17, wherein the conductive element comprises a seed layer disposed between the copper and the insulating layer.

24. The structure of claim 23, wherein the seed layer comprises a tantalum alloy.

25. The method of claim 1, wherein the upper insulating layer comprises a passivation layer.

26. The method of claim 1, wherein the copper-oxide layer is at least 40 nanometers thick.

27. The semiconductor device of claim 17, wherein the oxide layer consists essentially of copper and oxygen.

* * * * *